(12) United States Patent
Yang

(10) Patent No.: US 7,235,458 B2
(45) Date of Patent: Jun. 26, 2007

(54) METHOD OF FORMING AN ELEMENT ISOLATION FILM OF A SEMICONDUCTOR DEVICE

(75) Inventor: Young Ho Yang, Cheonju-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 140 days.

(21) Appl. No.: 11/010,755

(22) Filed: Dec. 13, 2004

(65) Prior Publication Data

US 2006/0088977 A1   Apr. 27, 2006

(30) Foreign Application Priority Data

Oct. 25, 2004   (KR) .................. 10-2004-0085429

(51) Int. Cl.
*H01L 21/76*   (2006.01)
(52) U.S. Cl. ...................... 438/424; 438/435
(58) Field of Classification Search ............... 438/424, 438/435
See application file for complete search history.

(56) References Cited

U.S. PATENT DOCUMENTS 6,153,480 A * 11/2000 Arghavani et al. .......... 438/296
6,214,697 B1 * 4/2001 Moore et al. ............... 438/424

FOREIGN PATENT DOCUMENTS

KR   2004-0006322   1/2004

* cited by examiner

*Primary Examiner*—Jack Chen
(74) *Attorney, Agent, or Firm*—Marshall, Gerstein & Borun LLP

(57) ABSTRACT

Disclosed herein is a method of forming an element isolation film of a semiconductor device. An aluminum oxide film of a high wet etch rate is used as a pad oxide film, a trench is formed, and top and bottom edges of the trench is made rounded while removing some of the aluminum oxide film by a cleaning process. It is thus possible to make the top and bottom edges of the trench rounded without using polymer. It is also possible to minimize generation of a moat due to a step between a field region and an active region in a cleaning process before a gate oxide film is formed.

10 Claims, 2 Drawing Sheets

METHOD OF FORMING AN ELEMENT ISOLATION FILM OF A SEMICONDUCTOR DEVICE

BACKGROUND OF THE DISCLOSURE

1. Field of the Invention

The disclosure generally relates to a method of forming an element isolation film of a semiconductor device. More particularly, the disclosure relates to a method of forming an element isolation film of a semiconductor device in which an aluminum oxide film of a high wet etch rate is used as a pad oxide film, trenches are formed, and top and bottom edge portions of the trenches are then made rounded while removing some of the aluminum oxide film through a cleaning process.

2. Brief Description of Related Technology

In a manufacture process of semiconductor devices, an element isolation film is formed in order to isolate an active region and a field region or elements. As the devices become higher integrated and miniaturized, however, the element isolation film is formed by etching the semiconductor substrate at a given depth, thus forming trenches, and then burying the trenches with an insulating film. This element isolation film is formed in such a manner that a pad oxide film, a pad nitride film and a photoresist film are formed on the semiconductor substrate, the photoresist film is patterned using an isolation mask, the pad nitride film, the pad oxide film and the semiconductor substrate are etched at a given depth using the patterned photoresist film as a mask, thus forming trenches, and the trenches are buried with the insulating film. In this time; the pad nitride film is formed by LPCVD. If the pad nitride film is directly brought into contact with the semiconductor substrate, however, a crystal defect is caused in the semiconductor substrate because of stress between the pad nitride film and the semiconductor substrate. Thus, before the pad nitride film is formed, the pad oxide film is formed. In this time, the pad oxide film is formed using a thermal oxide film of a low wet etch rate.

Meanwhile, in a trench etch process for forming this trench type element isolation film, the roundness of the top edges of the trenches has an influence on characteristics such as a cell threshold voltage and refresh in a DRAM, and affects characteristics such as erase and standby current in a flash memory device. Accordingly, in order to make the top edges of the trench rounded, an etch process is performed using polymer generated when the pad nitride film is etched.

The etch process using polymer will be described in short. If the pad nitride film, the pad oxide film and the semiconductor substrate are etched so as to form the trench, an etch gas and the pad nitride film show a polymerization reaction. While polymer is generated, it is accumulated at the top edges of the trench. The accumulated polymer has an etch selective ratio different from that the semiconductor substrate. Thus, as the accumulated polymer serves as an etch stopper when the semiconductor substrate is etched, the top edges of the trench where polymer is accumulated are rarely etched compared to the center of the trench. Accordingly, the top edges of the trench are made rounded.

It is, however, very difficult to uniformly deposit polymer on the sidewalls of the pad oxide film so as to make the top of the trench rounded using polymer. Furthermore, there are problems in that foreign materials are generated in an etch apparatus as polymer is generated, and it is difficult to secure reappearance depending on a characteristic of an etch apparatus.

Meanwhile, the pad oxide film is formed using the thermal oxide film of a low wet etch rate. It is thus difficult to remove the pad oxide film in the cleaning process before the gate oxide film is formed. Furthermore, there is a problem in that a moat deepens because of a step between the field region and the active region because a gap filling material of a relatively high etch rate is first etched when the pad oxide film is removed.

SUMMARY OF THE DISCLOSURE

Disclosed herein is a method of forming an element isolation film of a semiconductor device in which top and bottom edge portions of a trench can be made rounded without performing an etch process using polymer. The roundness of top and bottom edges of a trench can be made uniform and generation of a moat due to a step between a field region and an active region in a cleaning process before a gate oxide film is formed can be minimized, by using an aluminum oxide film of a high wet etch rate as a pad oxide film.

The method includes forming a pad oxide film and a pad nitride film on a semiconductor substrate, etching a predetermined region of the pad nitride film and the pad oxide film and then etching the semiconductor substrate to form a trench. The method also includes performing a cleaning process to make top and bottom edges of the trench rounded while removing a portion of the pad oxide film, forming an oxide film on the entire surface so that the trench is buried, and polishing the oxide film and then removing the oxide film, the pad nitride film and the pad oxide film.

The pad oxide film can include an aluminum oxide film. Preferably, the aluminum oxide film is formed by ALD or high vacuum CVD, and the pad nitride film is formed by LPCVD through thermal decomposition of $SiH_2Cl_2$ and $NH_3$. The cleaning process preferably is performed by selectively using $NH_4OH$, BOE or HF.

Preferably, the method further includes forming a well oxide film on the trench and then forming a liner insulating film on the entire surface. The liner insulating film preferably is formed using a HTO oxide film, a nitride film, or a multi-layer of the HTO oxide film and the nitride film, and the oxide film preferably is formed by HDP or LPCVD.

The oxide film and the pad nitride film preferably are removed by a wet etch process, and the wet etch process preferably is performed using a HF-containing solution or a $H_3PO_4$-based solution. Preferably, the pad oxide film is removed by a cleaning process using a $NH_4OH$ solution or a mixing solution of HF and $NH_4OH$.

Additional features of the disclosed method may become apparent to those skilled in the art from a review of the following detailed description, taken in conjunction with the drawing figures and the appended claims.

BRIEF DESCRIPTION OF THE DRAWINGS

For a more complete understanding of the disclosure, reference should be made to the following detailed description and accompanying drawing wherein.

Figure 1A:
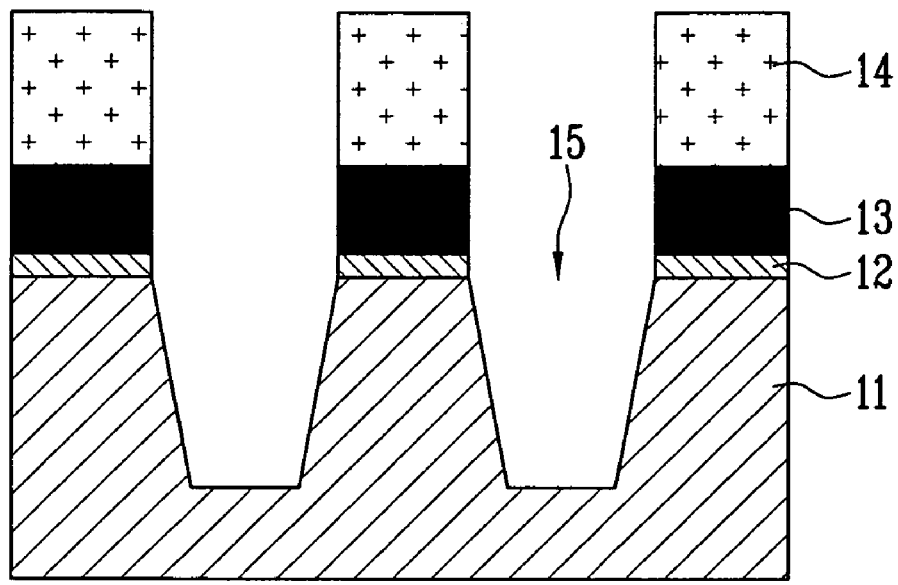
FIGS. 1A to 1D are sectional views for explaining a method of forming an element isolation film of a semiconductor device according to an embodiment of the present invention.

While the disclosed method is susceptible of embodiments in various forms, there are illustrated in the drawing (and will hereafter be described) specific embodiments, with the understanding that the disclosure is intended to be illustrative, and is not intended to limit the claimed invention to the specific embodiments described and illustrated herein

DETAILED DESCRIPTION OF THE PREFERRED EMBODIMENTS

Now, the preferred embodiments according to the present invention will be described with reference to the accompanying drawings. FIGS. 1A to 1D are sectional views showing for explaining a method of forming an element isolation film of a semiconductor device according to an embodiment of the present invention. Referring to FIG. 1A, a pad oxide film 12, a pad nitride film 13 and a photoresist film 14 are formed on a semiconductor substrate 11. In this time, the pad oxide film 12 is formed using an aluminum oxide film ($Al_2O_3$) of a high wet etch rate in a subsequent process. The aluminum oxide film can be formed by atomic layer deposition (ALD) or high vacuum CVD. Furthermore, the pad nitride film 13 is formed by LPCVD and is formed by thermally decomposing $SiH_2Cl_2$ and $NH_3$. The photoresist film 14 is patterned by a photolithography process using an isolation mask. After the pad nitride film 13 and the pad oxide film 12 are etched using the patterned photoresist film 14 as a mask, the semiconductor substrate 11 is etched at a given depth to form trenches 15.

Figure 1B:
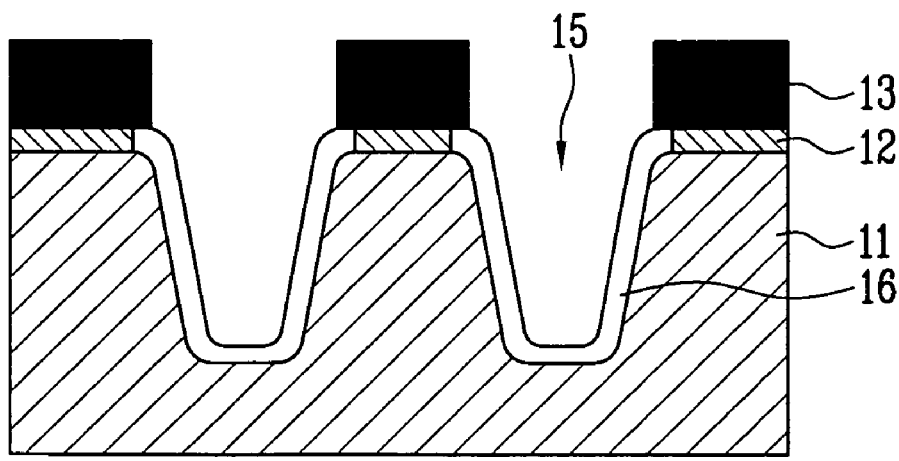

Referring to FIG. 1B, after the photoresist film 14 is stripped, a cleaning process is performed to make top and bottom edge portions of the trenches 15 rounded, while removing some of the pad oxide film 12. In this time, the cleaning process removes some of the pad oxide film 12 and makes the top and bottom edges of the trenches 15 rounded by selectively using $NH_4OH$, BOE or HF. A wall oxide film 16 for removing plasma damage is then formed.

Figure 1C:
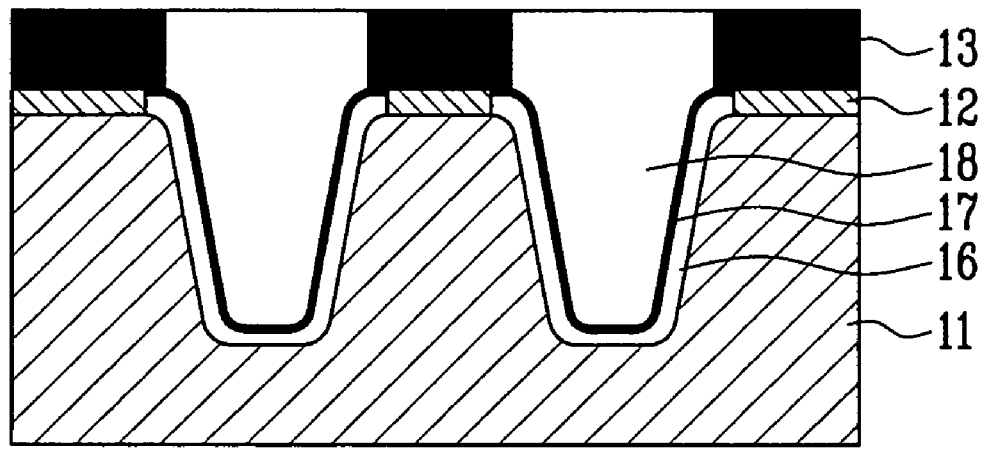

Referring to FIG. 1C, after a liner insulating film 17 is formed on the entire surface, an oxide film 18 is formed to bury the trenches 15. In this time, the liner insulating film 17 is formed using a HTO oxide film, a nitride film, or a multi-layer of them. Furthermore, the oxide film 18 is formed by HDP or LPCVD. Generally, as the design rule shrinks, the oxide film 18 is formed by HDP. The oxide film 18 is polished by CMP.

Figure 1D:
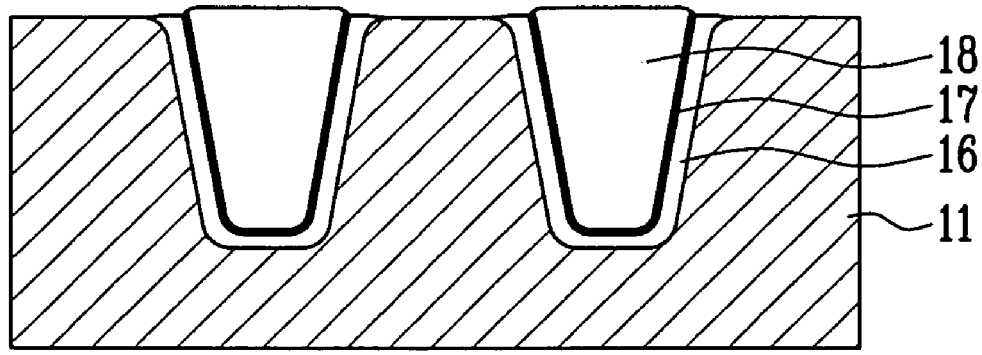

Referring to FIG. 1D, some of the oxide film 18 and the pad nitride film 13 are removed by a wet etch process. In this time, the wet etch process is effected using a HF-containing solution and a $H_3PO_4$-based solution. Thereafter, a cleaning process using a $NH_4OH$ solution or a mixing solution of HF and $NH_4OH$ is performed to remove the pad oxide film 12 remaining on the semiconductor substrate 11, thus forming a gate oxide film (not shown).

As described above, according to the present invention, an aluminum oxide film of a high wet etch rate is used as a pad oxide film, a trench is formed, and top and bottom edges of the trench is made rounded while removing some of the aluminum oxide film by a cleaning process. It is thus possible to make the top and bottom edges of the trench rounded without using polymer. It is also possible to minimize generation of a moat due to a step between a field region and an active region in a cleaning process before a gate oxide film is formed.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming an element isolation film of a semiconductor device, the method comprising:
    (a) forming an aluminum oxide film for a pad oxide film on a semiconductor substrate by performing Atomic Layer Deposition (ALD) and forming a pad nitride film on the aluminum oxide film;
    (b) etching a predetermined region of the pad nitride film and the pad oxide film and then etching the semiconductor substrate to form a trench;
    (c) performing a cleaning process to make top and bottom edges of the trench rounded and to remove a portion of the pad oxide film under the pad nitride film;
    (d) forming an oxide film on an entire surface so that the trench is buried; and,
    (e) polishing the oxide film and then removing the oxide film, the pad nitride film and the pad oxide film.

2. The method of claim 1, wherein the pad nitride film is formed by LPCVD through thermal decomposition of $SiH_2Cl_2$ and $NH_3$.

3. The method of claim 1, wherein the cleaning process is performed by selectively using $NH_4OH$, BOE or HF.

4. The method of claim 1, further comprising forming a wall oxide film on the trench and then forming a liner insulating film on the entire surface.

5. The method of claim 4, wherein the liner insulating film is formed using a HTO oxide film, a nitride film, or a multi-layer of the HTO oxide film and the nitride film.

6. The method of claim 1, wherein the oxide film is formed by HDP or LPCVD.

7. The method of claim 1, wherein the oxide film and the pad nitride film are removed by a wet etch process.

8. The method of claim 7, wherein the wet etch process is performed using a HF-containing solution or a $H_3PO_4$-based solution.

9. The method of claim 1, wherein the pad oxide film is removed by a cleaning process using a $NH_4OH$ solution or a mixing solution of HF and $NH_4OH$.

10. The method of claim 4, wherein the wall oxide film is formed on the sidewall and bottom of the trench as well as between the pad nitride film and the semiconductor substrate of top corners of the trench.

* * * * *